United States Patent
Li et al.

(10) Patent No.: US 8,880,973 B1
(45) Date of Patent: *Nov. 4, 2014

(54) DETECTOR-DECODER INTERFACE FOR GF(Q) ITERATIVE DECODING

(75) Inventors: Shu Li, San Jose, CA (US); Chaichanavong Panu, Sunnyvale, CA (US); Jun Gao, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 256 days.

This patent is subject to a terminal disclaimer.

(21) Appl. No.: 13/364,783

(22) Filed: Feb. 2, 2012

Related U.S. Application Data

(60) Provisional application No. 61/439,320, filed on Feb. 3, 2011, provisional application No. 61/501,126, filed on Jun. 24, 2011.

(51) Int. Cl.
*H03M 13/00* (2006.01)
*H03M 13/25* (2006.01)
*H03M 13/11* (2006.01)

(52) U.S. Cl.
CPC ........ *H03M 13/255* (2013.01); *H03M 13/1151* (2013.01); *H03M 13/1105* (2013.01); *H03M 13/1111* (2013.01); *H03M 13/1148* (2013.01)
USPC ............ 714/752; 714/780; 714/786; 714/799

(58) Field of Classification Search
CPC ..................................................... H03M 13/255
USPC .......................................... 714/752, 780, 786
See application file for complete search history.

(56) References Cited

U.S. PATENT DOCUMENTS

| | | | | |
|---|---|---|---|---|
| 7,237,181 | B2* | 6/2007 | Richardson | 714/780 |
| 8,020,078 | B2* | 9/2011 | Richardson | 714/780 |
| 8,402,324 | B2* | 3/2013 | Gunnam et al. | 714/701 |
| 8,464,142 | B2* | 6/2013 | Gunnam et al. | 714/786 |
| 8,621,289 | B2* | 12/2013 | Gunnam | 714/701 |
| 2010/0042906 | A1* | 2/2010 | Gunnam et al. | 714/780 |

* cited by examiner

*Primary Examiner* — Esaw Abraham

(57) ABSTRACT

Systems and methods are provided for GF(q) iterative decoding. A decoder computes a plurality of R messages corresponding to a variable node of the decoder and forms decoder extrinsic information for the variable node by combining the plurality of R messages. The decoder stores the decoder extrinsic information in a memory during a first time period and retrieves the decoder extrinsic information from the memory during a second time period, the second time period occurring after the first time period. The decoder extrinsic information is provided to a soft detector.

20 Claims, 9 Drawing Sheets

DETECTOR-DECODER INTERFACE FOR GF(Q) ITERATIVE DECODING

CROSS REFERENCE TO RELATED APPLICATION

This application claims the benefit under 35 U.S.C. §119 (e) of U.S. Provisional Application No. 61/439,320, filed Feb. 3, 2011 and U.S. Provisional Application 61/501,126, filed Jun. 24, 2011, which are hereby incorporated by reference herein in their entireties.

FIELD OF USE

The present disclosure relates generally to data decoding, and more particularly to non-binary iterative decoders for data encoded with a low density parity check (LDPC) encoder.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in noisy communications or a data storage channel. The information may be encoded (by an LDPC encoder) prior to transmission and then subsequently decoded (by a LDPC decoder) when received. The performance capability of an LDPC coding scheme is often described by the code's performance curve. The performance curve is a plot of signal-to-noise ratios (SNRs) vs. Bit Error Rate (BER), or equivalently Sector Error Rate (SER). LDPC codes are one of the best performing error correcting codes, along with Turbo codes, for use in correcting errors in information transmitted on communication and data storage channels.

Traditional LDPC decoders compute decoder extrinsic information by computing a P message for a given variable node of a LDPC code, and then subtract detector extrinsic information from the P message to obtain the decoder extrinsic information. This process may be repeated for some or all of the variable nodes of the LDPC code. Traditional LDPC decoders store the detector extrinsic information in memory, and load the detector extrinsic information at an appropriate time to form the decoder extrinsic information via subtraction.

SUMMARY

Systems and methods are provided for GF(q) iterative decoding.

In one embodiment of the present disclosure, a method for decoding a codeword using a decoder is disclosed. The method includes computing a plurality of R messages corresponding to a variable node of the decoder and forming decoder extrinsic information for the variable node by combining the plurality of R messages. The method also includes storing the decoder extrinsic information in a memory during a first time period and retrieving the decoder extrinsic information from the memory during a second time period, the second time period occurring after the first time period. The method also includes providing the decoder extrinsic information to a soft detector.

In some implementations, a depth of the memory is based on a characteristic data path latency, and independent of the number of symbols in the codeword.

In some implementations, the memory is implemented as a First-In-First-Out (FIFO) buffer.

In some implementations, the method also includes retrieving the decoder extrinsic information from the FIFO buffer and combining the decoder extrinsic information with detector extrinsic information.

In some implementations, the decoder is connected in series with a full shift calculator module. The full shift calculator module is configured to cyclically shift a decoder channel information circulant to a desired position and write the circulant into a memory of the decoder.

In another embodiment, a system for decoding a codeword is disclosed. The system includes a detector-decoder interface comprising a memory. The system also includes a decoder configured to compute a plurality of R messages corresponding to a variable node of the decoder using a message passing process; form decoder extrinsic information for the variable node by combining the plurality of R messages; and provide the decoder extrinsic information to the detector decoder interface for storing the decoder extrinsic information in the memory during a first time period. The system also includes a soft detector configured to receive the decoder extrinsic information from the memory during a second time period, the second time period occurring after the first time period. The soft detector is also configured to form detector extrinsic information for processing by the detector-decoder interface.

In some implementations, a depth of the memory is based on a characteristic data path latency, and independent of the number of symbols in the codeword.

In some implementations, the memory is implemented as a First-In-First-Out (FIFO) buffer.

In some implementations, the detector-decoder interface is configured to combine the decoder extrinsic information and the detector extrinsic information.

In some implementations, the decoder is connected in series with a full shift calculator module, wherein the full shift calculator module is configured to cyclically shift a decoder channel information circulant to a desired position.

In some implementations, the decoder includes an interleaver configured to interleave the detector extrinsic information.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

Figure 1:
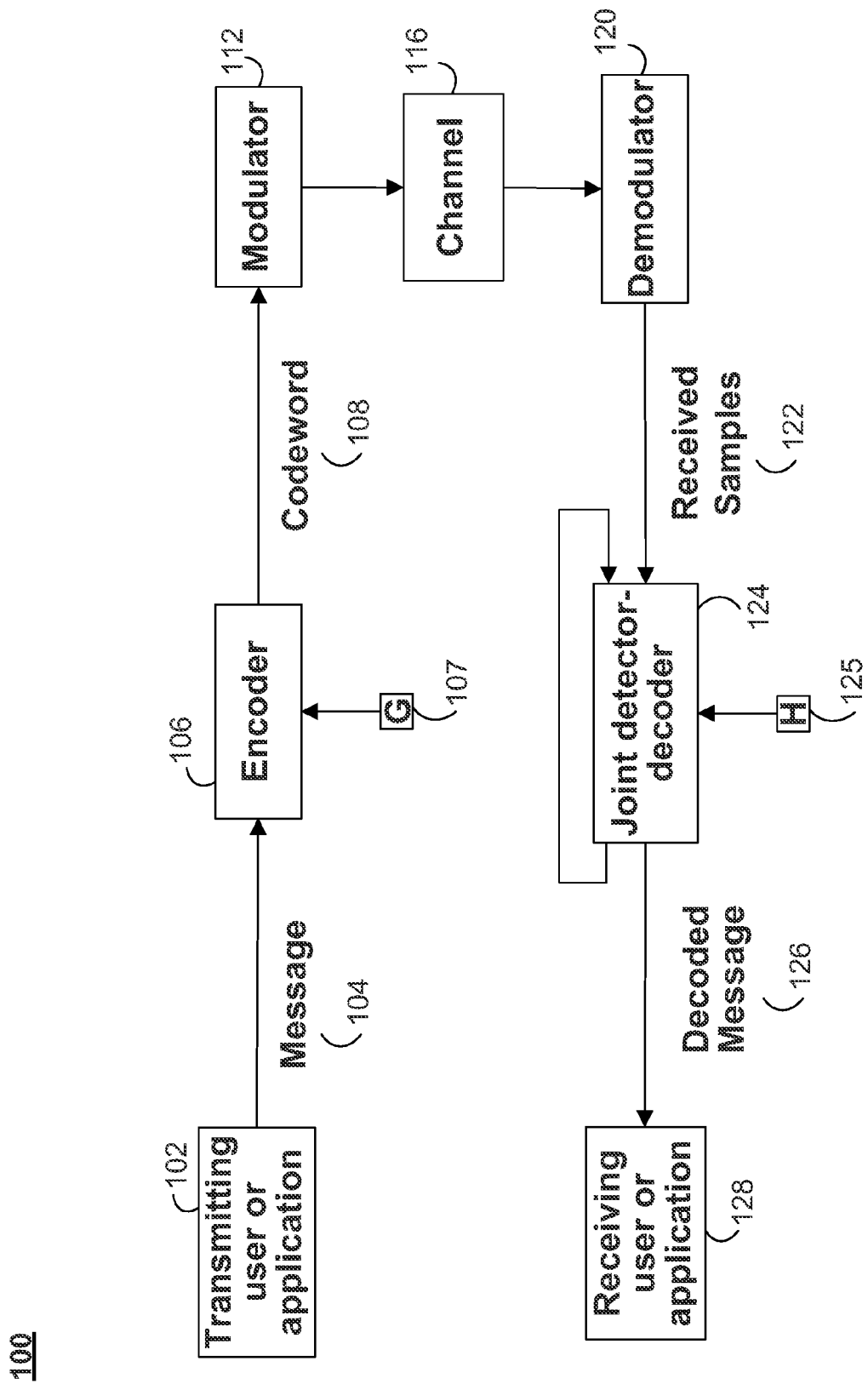
FIG. 1 shows an illustrative communications system employing joint detection and decoding in accordance with some arrangements.

FIG. 1 shows an illustrative communications system employing joint detection and decoding in accordance with some arrangements. Communications system 100 is used to transmit information from transmitting user or application 102 to receiving user or application 128. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by the transmitting user or application 102 may be a digital data stream.

The transmitting user or application 102 may segment or otherwise divide the data stream into blocks of a fixed length of k symbols. In particular, message 104, also referred to as m, represents one of these blocks. In particular, the message 104 is k symbols in length, where each symbol may be binary data, ternary data, quaternary data, any other suitable type of data, or any suitable combination thereof. Encoder 106 is used to encode the message 104 to produce codeword 108. In a preferred arrangement, the encoder 106 is an LDPC encoder. However, based on the disclosure and teachings provided herein, it should be clear that the encoder 106 may also be a turbo encoder or any other suitable encoder. The codeword 108, also referred to as c, has a length of n symbols, where n>k. The encoder 106 uses generator matrix G 107, also referred to as G for notational convenience, to produce the codeword. For example, the encoder 104 may perform one or more matrix operations to convert the message 104 into the codeword 108. In an arrangement, the encoder 106 produces the codeword 108 from the message 104 using the generator matrix G 107 by the following matrix multiplication $$c = Gm.$$

The codeword 108 may be modulated or otherwise transformed by modulator 112 into a waveform suitable for transmission and/or storage on channel 116. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 116 refers to the physical medium through which the transmitted waveform passes or is stored on before being recovered at demodulator 120. For example, the channel 116 may be a storage channel that represents a magnetic recording medium in a computer system environment or a communications channel that represents the wireless propagation environment in a wireless communications environment. Various characteristics of the channel 116 may corrupt data that is communicated or stored thereon. For example, the channel 116 may be a non-ideal memoryless channel or a channel with memory. The output of the channel 116 is demodulated and processed by the demodulator 120 to produce received samples 122. The demodulator 120 may use frequency filters, multiplication and integration by periodic functions, and/or any other suitable demodulation technique to demodulate and/or process the output of the channel 116.

The received samples 122 contain information related to the codeword 108 and generally corresponds to a corrupted or otherwise altered version of the codeword 108 originally output by the encoder 106. For example, the received samples 122 may contain a preliminary estimate or noisy version of the codeword 108, a probability distribution vector of possible values of the codeword produced by the encoder 106, or to combinations of these as well other values.

Joint detector-decoder 124 is used to process the received samples 122 to produce decoded message 126, which is an estimate of the original data message 104. In an arrangement, the joint detector-decoder 124 first computes initial LLR values based on the received samples 122, a statistical description of the channel 116, and/or a probability distribution on the output of the encoder 106. These initial LLR values are then iteratively processed within the joint detector-decoder 124. In general, the joint detector-decoder 124 may be used to iteratively correct and/or detect errors present in the received samples 122, for example, due to transmission through the channel 116. In an arrangement, iterative code decoder uses parity check matrix H 125 to produce the decoded message 126. The joint detector-decoder 124 may use any suitable decoding algorithm to produce the decoded message 126. For example, the joint detector-decoder 124 may use decoding algorithms known as belief propagation algorithms with the parity check matrix H 125 to produce the decoded message 126.

The decoded message 126 is delivered to the receiving user or application 128 after being processed by the joint detector-decoder 124. The receiving user or application 128 may correspond to the same device or entity as the transmitting user or application 102, or the receiving user or application 128 may correspond to a different device or entity. Further, the receiving user or application 128 may be either co-located or physically separated from the transmitting user or application 102. If the joint detector-decoder 124 corrects all errors that are induced by the channel 116 and other communications effects in the communications system 100, then the decoded message 126 is a logical replica of the message 104. Otherwise, the decoded message 126 may differ from the message 104, and the joint detector-decoder 124 may declare an error accordingly.

Figure 2:
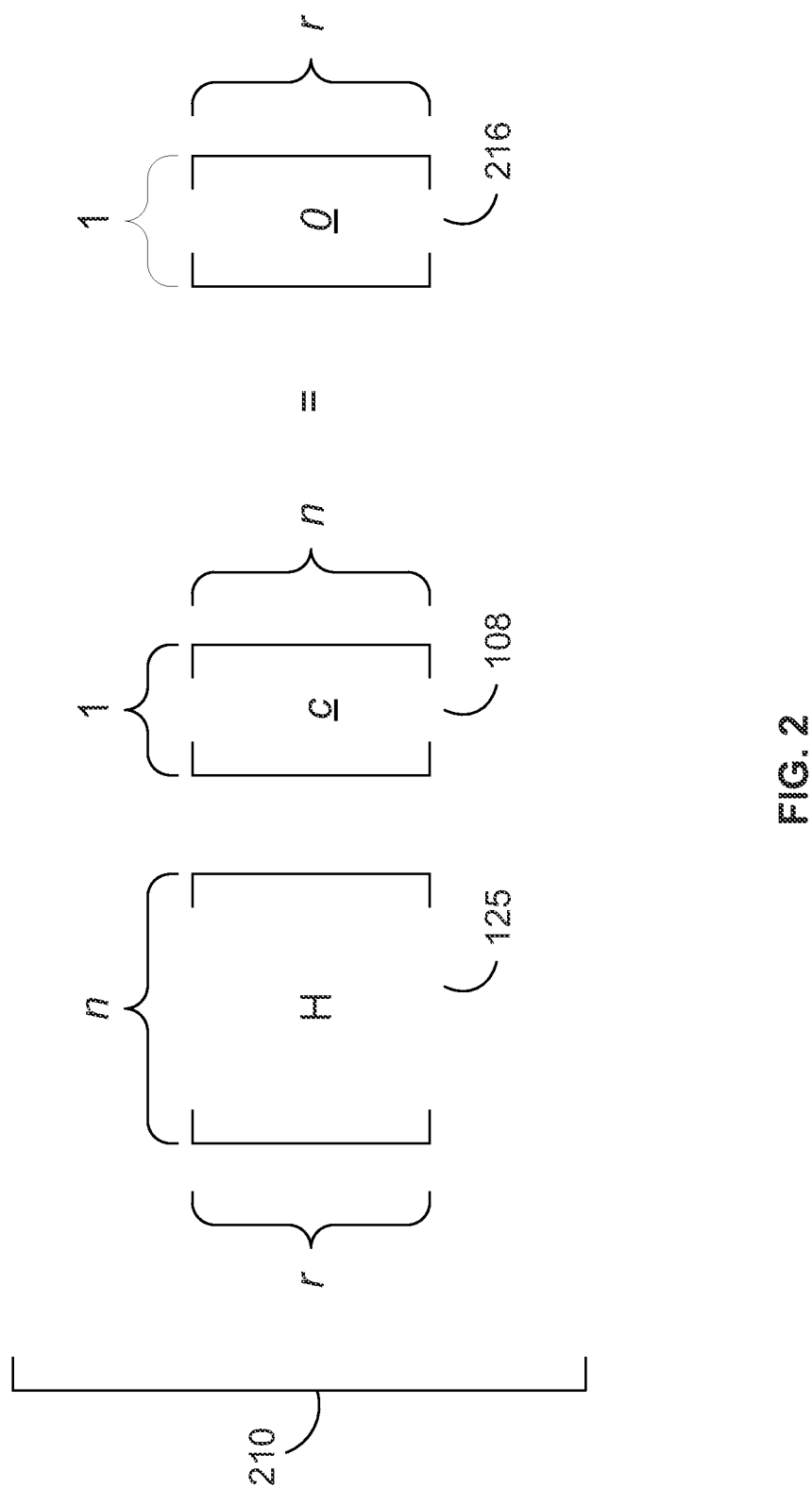
FIG. 2 shows an illustrative example of properties of a codeword using a mathematical vector model in accordance with some arrangements.

FIG. 2 shows an illustrative example of properties of a codeword using a mathematical vector model in accordance with some arrangements. For example, the codes processed by the encoder 106 and the joint detector-decoder 124 of FIG. 1 may be represented by mathematical vector models as depicted in FIG. 2. Equation 210 illustrates the parity check matrix H 125 of FIG. 1, which may include non-binary elements. As depicted, the parity check matrix H 125 is of size r×n, and corresponds to codewords of length n and syndromes of length r. Syndrome length r satisfies the equality r=n−k. When the codeword 108 of FIG. 1 is matrix multiplied by the parity check matrix H 125, the result is zero-vector 216, which is a vector of size r×1 having all elements equal to zero. The parity check matrix H 125 has a maximum column weight, referred to a $cw_{max}$, defined to be the maximum number of non-zero entries across all columns of the parity check matrix H 125. The parity check matrix H 125 is not necessarily unique, and may be chosen to be computationally convenient and/or to decrease the number of errors generated by the message passing algorithm in the joint detector-decoder 124 of FIG. 1.

The parity check matrix H 125 may take on any suitable value. For example, entries of the parity check matrix H 125 may belong to GF(q), where q is any suitable integer. In an arrangement, entries of the parity check matrix H 125 are non-binary values defined in GF(4), and thus take on four different values. For example, in an arrangement, the parity check matrix H 125 is represented by $$H = \begin{bmatrix} 1 & 2 & 0 & 3 & 0 \\ 0 & 2 & 1 & 0 & 2 \end{bmatrix}$$

and the codeword 108 of FIG. 1 is represented by $c=[2\ 1\ 3\ 0\ 3]^T$ (the size of the parity check matrix H 125 is typically much larger than that shown in the example above, and smaller matrix sizes are used for ease of presentation). Addition and multiplication may be performed in GF(4) according to the following tables:

| addition | 0 | 1 | 2 | 3 | | Multiplication | 0 | 1 | 2 | 3 |
|---|---|---|---|---|---|---|---|---|---|---|
| 0 | 0 | 1 | 2 | 3 | | 0 | 0 | 0 | 0 | 0 |
| 1 | 1 | 0 | 3 | 2 | | 1 | 0 | 1 | 3 | 2 |
| 2 | 2 | 3 | 0 | 1 | | 2 | 0 | 2 | 3 | 1 |
| 3 | 3 | 2 | 1 | 0 | | 3 | 0 | 3 | 1 | 2 | where the result of an addition of an entry in the first row with an entry in the first column is shown in the left table and the result of a multiplication of an entry in the first row with an entry in the first column is shown in the right table. The result, therefore, of multiplying the above shown parity check matrix H 125 with the codeword $c=[2\ 1\ 3\ 0\ 3]^T$ is a zero vector, because $1(2)+2(1)+0(3)+3(0)+0(3)=0$ and $0(2)+2(1)+1(3)+0(0)+2(3)=0$.

As described above, entries of the parity check matrix H 125 may more generally be from GF(q). In general, operations such as addition and multiplication associated with GF(q) codewords may be defined according to finite field arithmetic associated with GF(q). Such operations associated with GF(q) codewords may be referred to as GF(q) operations.

Figure 3:
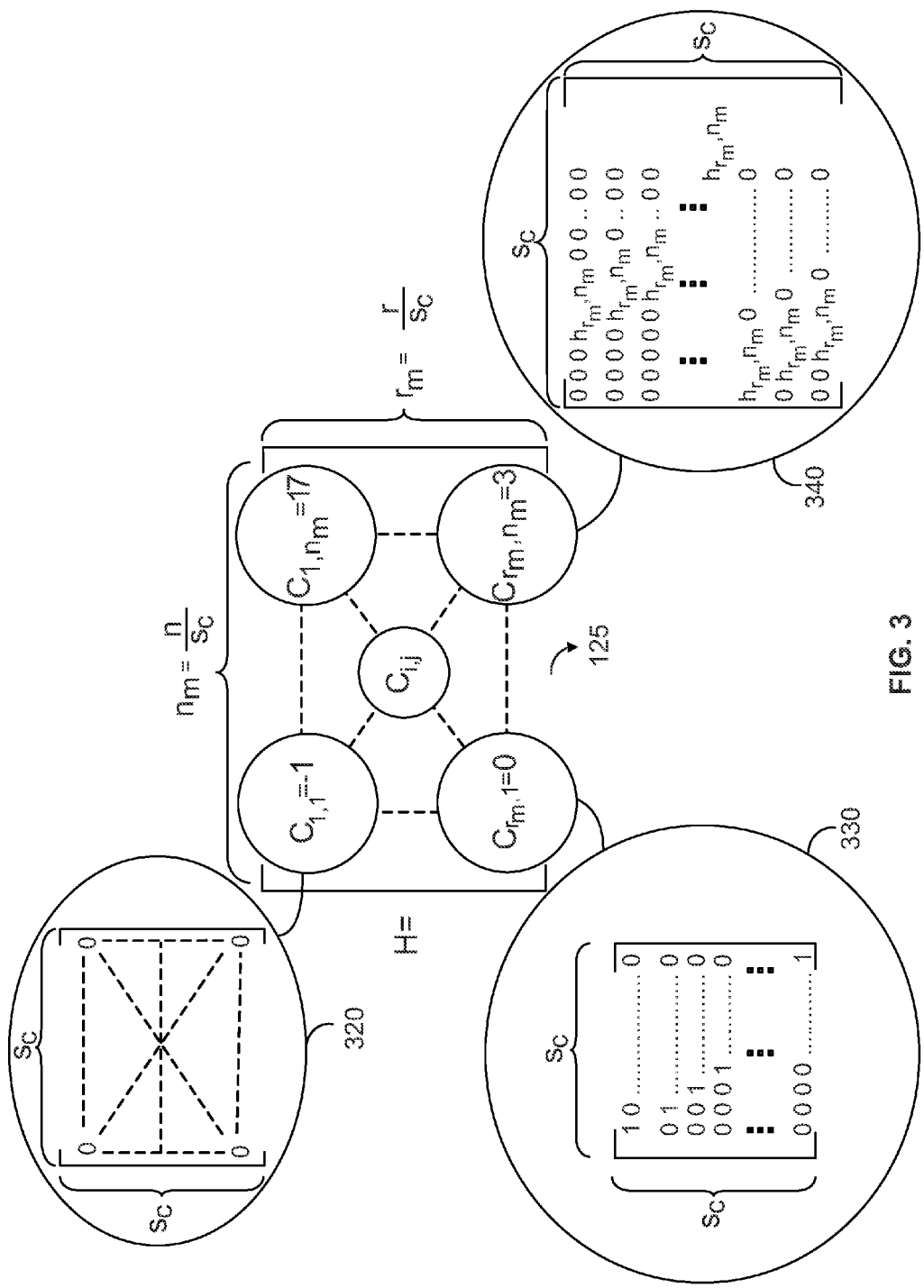
FIG. 3 shows a parity check matrix H in a mother matrix representation in accordance with some arrangements.

FIG. 3 shows the parity check matrix H 125 in a mother matrix representation in accordance with some arrangements. The mother matrix representation depicted in FIG. 3 may be advantageous in illustrating the structure of the parity check matrix H 125 when the parity check matrix H 125 is a large matrix. In the mother matrix representation, there is no requirement to store (or explicitly list) each element of the parity check matrix H 125. A quasi-cyclic parity check matrix in a mother matrix representation may be made up of circular submatrices known as circulants. Circulant 340 is one such matrix. The circulant 340 is a square matrix, i.e., the circulant 340 has the same number of rows as columns. This number is commonly referred to as the circulant size, $S_c$. In addition, circulants have the property that for any given positive integer $C_{i,j}<S_c$, any row/column of the circulant matrix may be cyclically shifted by $C_{i,j}$ positions to obtain another row/column. The value of each non-negative integer in the parity check matrix H 125 specifies the corresponding circulant submatrix in terms of a "shift," $C_{i,j}$, relative to a non-binary identity matrix (e.g., defined by elements which are "0" and elements which are one or more binary or non-binary values, $h_{x,y}$). For example, the number zero represents one type of identity matrix, identity matrix 330 of size $S_c$. The number three represents matrix 340 which is the non-binary identity matrix 330 with each row cyclically shifted to the right by three positions (and potentially scaled by a constant amplitude value). As a matter of notation, minus-one denotes the all-zero matrix 320. For brevity, the phrase "non-zero circulant" will be used to refer to a circulant matrix that is not the all-zero matrix. If the parity check matrix H 125 is of size [r×n], then the size of the mother matrix is $[r_m=r/S_c \times n_m=n/S_c]$, where $S_c$, r, and n are chosen so that $r_m$ and $n_m$ are integers.

The implementation of the encoder 106 and the joint detector-decoder 124 of FIG. 1 may be significantly simplified using a mother matrix representation of the parity check matrix H 125. One reason for this is that the mother matrix representation provides a simplified storage scheme for the parity check matrix H 125, since only the first row or column of each circulant matrix needs to be stored in order to generate the entire circulant. If the circulant is sparse (has low row/column weight) then the parity check matrix H 125 may be stored by simply storing the positions and the values in its first row (or first column). Furthermore by using the mother matrix representation of the parity check matrix H 125, the storage of the messages used during a decoding of a LDPC vector within an LDPC decoder may be made more compact and parallelization in the encoder/decoder may be achievable with simple shifting operations, since adjacent rows (or adjacent columns) corresponding to the same circulant are cyclic shifts of each other. In addition, for some non-binary quasi-cyclic LDPC codes, encoding and decoding can be further simplified by efficient address generation.

Figure 4:
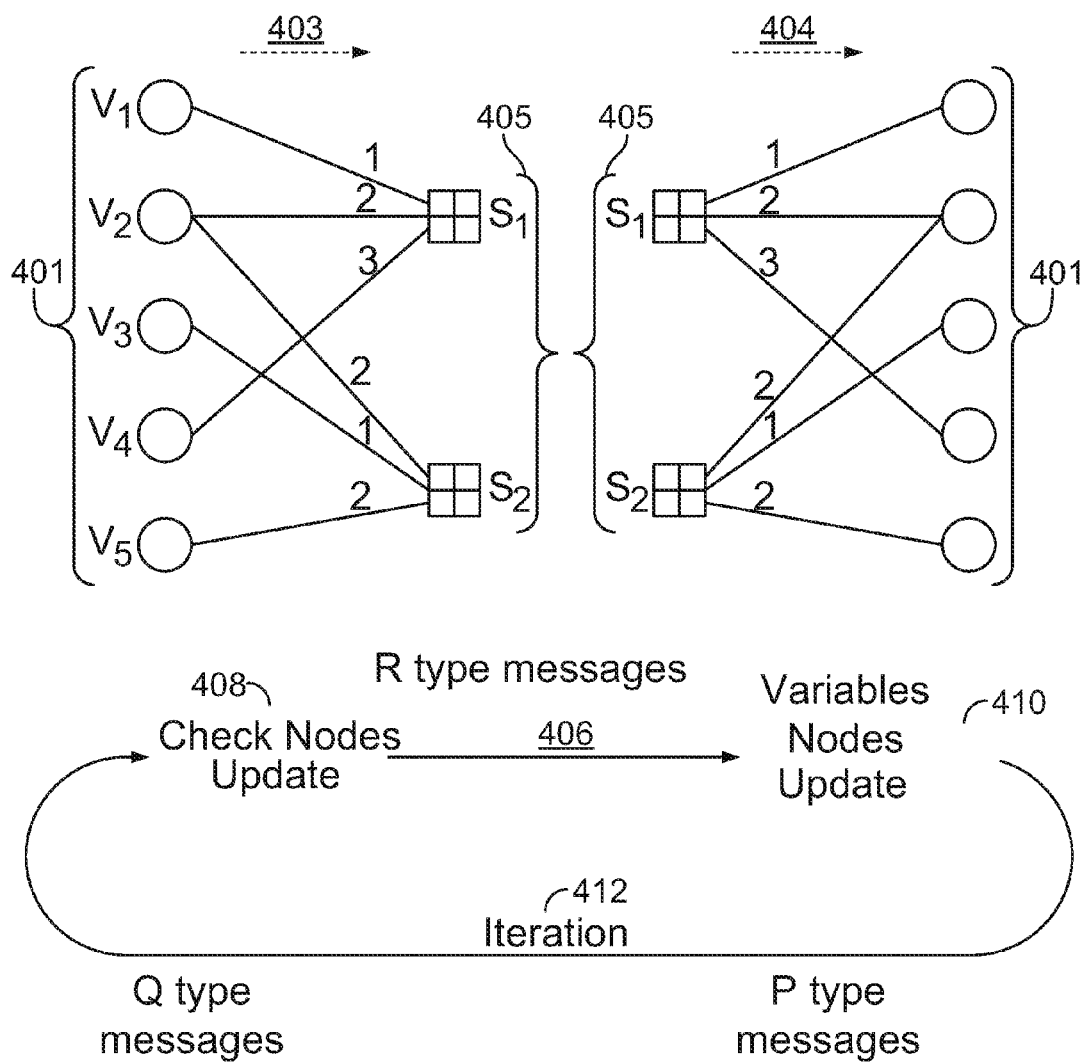
FIG. 4 shows a graphical illustration of an LDPC code, including an illustrative example of the parity check matrix H, in accordance with some arrangements.

FIG. 4 shows a graphical illustration 400 of an LDPC code, including an illustrative example of the parity check matrix H 125, in accordance with one arrangement. As illustrated in FIG. 4, an LDPC code may be graphically represented by a Tanner graph, i.e., a bipartite graph showing a relationship between codeword symbols (equivalently variables) and parity check equations. The advantages of using a Tanner graph representation of an LDPC code include use of efficient graph-based message-passing algorithms for decoding. There are two types of nodes shown in Tanner graphs 403 and 404. Variable nodes 401 represent each position in codeword 108 of FIG. 1 and are denoted by circles. Thus, there are n variable nodes corresponding to the n symbols of the codeword 108. Variable nodes may also be referred to as symbol nodes. Check nodes 405 represent a syndrome (syndrome equation or parity check equation) of a decoded codeword. Thus, there are n−k check nodes. Check nodes are denoted by squares.

The Tanner graphs 403 and 404 correspond to the parity check matrix H 125 as illustrated in FIG. 4. The check nodes and variable nodes of the Tanner graphs 403 and 404 correspond to the rows and columns of the parity check matrix H 125, respectively. In particular, the undirected, weighted edges connecting check nodes with variable nodes correspond to the locations of the non-zero entries of the parity check matrix H 125. The weight (or, equivalently coefficient) $h_{x,y}$, on each weighted edge corresponds to the value at the (x,y) location of the parity check matrix H 125. For example, the "1" at the (1,1) location and the "2" at the (1,2) location of the parity check matrix H 125 indicate that there is an edge of weight one between check node $S_1$ and variable node $V_1$, and that there is an edge of weight two between check node $S_1$ and variable node $V_2$, respectively. Similarly, the lack of an edge between check node $S_2$ and variable node $V_1$ corresponds to the "0" at the (2,1) location of the parity check matrix H 125. Therefore, if there are $d_v$ non-zero entries in a given column of the parity check matrix H 125, then there are $d_v$ weighted edges emanating from the variable node corresponding to that column. Equivalently, the variable node corresponding to that column is of a degree $d_v$. Similarly, if there are $d_c$ non-zero entries in a given row of the parity check matrix H 125, then there are $d_c$ edges emanating from the check node corresponding to that row. Equivalently, the check node corresponding to that row may have a degree of $d_c$.

The check nodes 405 are referred to as either "satisfied" or "unsatisfied," where a satisfied node has a value of zero and an unsatisfied node has a non-zero value. A check node is satisfied (i.e., equal to zero), if the values at the variable nodes connected to the check node, each multiplied by their respective weight, sum to the value zero. In performing this calculation, multiplication and addition are defined with respect to the Galois field from which symbols for the LDPC code (or codeword) are determined. For example, check node $S_2$ of the Tanner graphs 403 and 404 is satisfied if the values at $V_2, V_3$, and $V_5$, multiplied by the respective weights (i.e., 2, 1, and 2, respectively) on the edges connecting these nodes to $S_2$, sum to zero. Furthermore, when a check node is unsatisfied, at least one of the variable nodes connected to it may be in error (i.e., the symbol or variable associated with the variable node is in error). Thus, the value of the check nodes (or equivalently, the value of the syndrome produced by the parity check matrix H 125) may provide a parity check on a received codeword (e.g., the received samples 122 of FIG. 1) by a decoder (e.g., the joint detector-decoder 124 of FIG. 1), thereby providing error correction capability to a communications system (e.g., the communications system 100 of FIG. 1).

The Tanner graphs 403 and 404 illustrate an iterative two-step decoding algorithm known as a message passing algorithm 406, where the message passing algorithm is employed by the joint detector-decoder 124 of FIG. 1. The message passing algorithm performs several rounds (or iterations) of message updates based on the structure of the Tanner graph associated with the parity check matrix H 125. The message passing algorithm may be used to decode the received samples 122 into the decoded message 126 of FIG. 1.

The update steps in the message passing algorithm 406 may be scheduled in multiple ways. For example, each iteration 412 of the message passing algorithm 406 may include processing several check nodes. For example, in the first iteration, a first subset of the check nodes 405 (e.g., check nodes $S_1$ and $S_2$) may request that some of the variable nodes 401, to which they are connected, send their current messages to these check nodes. Check nodes $S_1$ and $S_2$ may then perform update 408 by carrying out computations based on the messages that they receive and a set of update rules. Then, check nodes $S_1$ and $S_2$ may send their current messages to the variable nodes to which they are connected. For example, check nodes $S_1$ and $S_2$ may send R type messages 407 to the variable nodes, $v_1$ through $v_5$, to which they are connected.

The variable nodes connected to check nodes $S_1$ and $S_2$ (i.e. variable nodes $V_1, V_2, V_4$ and nodes $V_2, V_3$ and $V_5$, respectively) may then perform update 410 by carrying out computations based on the messages that they receive and a set of update rules. The update 410 may produce P type messages 411 based on the received R type messages 407 according to any suitable processing algorithm, e.g., according to a linear weighing algorithm. Further, variable nodes may pass Q type messages 413 back to check nodes, e.g. check nodes $S_1$ and $S_2$, to complete an iteration of the message passing algorithm 406. In this way, each iteration 412 may include a subset of the check nodes 405, not already updated, that may perform the update 408 and variable nodes connected to these check nodes may then perform the update 410.

The iteration 412 may be repeated until either a received vector has been decoded or until a threshold number of iterations has been reached. The messages that are sent during each step of each iteration of the message passing algorithm 406 may depend on the update rules and the scheduling of the update steps.

Prior to the first iteration of the message passing algorithm 406, each of the variable nodes 401 of FIG. 4 may receive or compute an initial message, $L_{initial}$ (discussed above) based on or derived from the entries of a received vector (e.g., the received samples 122 in FIG. 1). As discussed above, each iteration of the message passing algorithm 406 may include two steps. In the first step, check nodes are updated and in the second step variable nodes are updated. In an arrangement, this process is repeated until a zero syndrome is achieved or until a threshold number of iterations has been performed.

For example, in the first step, a group of variable nodes within the set of the variable nodes 401 may send their current messages to a group of check nodes (e.g. to be processed in a first layer of message passing decoding) within the set of the check nodes 405 to which they are connected. These messages may each be appropriately translated (i.e., multiplied or re-mapped) by the respective weight on the edge connecting the particular one of the variable nodes 401 with a particular one of the check nodes to produce a weighted message. The group of check nodes may then perform the update 408 by carrying out computations based on the weighted messages that they receive and a set of update rules. For example, these check nodes may each receive $d_c$ messages, each from a different variable node to which it is connected. Each message sent from the group of variable nodes to the group of check nodes, and appropriately weighted, may be labeled as a Q type message. Each Q type message may be in a metric vector form, a LLRV form, or any other suitable form. An a-posteriori probability (APP) message computed for any node in the group of variable nodes, and appropriately weighted, may be labeled as a P type message. Each P type message may be in a metric vector form or a LLRV form. Q type or P type messages may be stored in the LDPC decoder's memory.

For example, messages sent from variable nodes to check nodes may be labeled $Q_1$ through $Q_{d_c}$. The group of check nodes may then update by computing each entry in a R type message (a vector) using each entry in the Q type message (a vector) and a min approximation. In one arrangement, using all of the Q type messages it received, each of the check nodes in the group of check nodes may compute a R type message based on the equation $$\tanh\left(\frac{R}{2}\right) = \prod_{k=1}^{d_c-1} \tanh\left(\frac{Q_k}{2}\right),$$

which may be approximated using min approximation $$R \approx \min(Q_k, \ldots, Q_{d_c-1}) \prod_{k=1}^{d_c-1} \text{sign}(Q_k).$$

In other arrangements, R type messages may be calculated using other equations/formulas (e.g., other min approximations) based on Q and/or P type messages. For example, decoders, as described in the present disclosure, may make use of any equation/formula to compute R type messages. In this case, the minimum may be with respect to the entries (equivalently components) of the Q type messages. The $Q_k$ messages (i.e. a number k of Q type messages) may be read directly from the memory of the decoder or may be reconstructed. The $Q_k$ messages may be reconstructed from the $P_k$ messages (i.e. a number k of P type messages) and the previous R type messages that may be read from the memory of the LDPC decoder. Therefore, the min approximation may be computed using P type messages in order to derive R type messages. Each R type message may be in a metric vector form or a LLRV form. The newly computed R messages may be sent to each of the variable nodes to which the check node is connected.

In the second step, a group of check nodes within the set of the check nodes 405 may send their current message to a group of variable nodes within the set of the variable nodes 401 to which they are connected. The group of variable nodes may then perform the update 410 by carrying out computations based on the messages that they receive and a set of update rules. For example, these variable nodes may each receive $d_v$ messages each from different check nodes to which it is connected. Each message sent from the group of check nodes to the group of variable nodes may be labeled as a R type message.

For example, the messages sent from check nodes to a variable node may be labeled $R_1$ through $R_{d_v}$. The group of variable nodes may then update by computing a Q type message using each R type message it received. Specifically, using its initial message, and each of the R type messages received, each variable node of the group of variable nodes may compute a Q type message based on the equation $$Q = L_{initial} + \sum_{j=1}^{d_v-1} R_j.$$

As used herein, $L_{initial}$ refers to both the initial message for a particular variable node (in LLRV form, as shown, in metric vector form, or in any other suitable form), and to subsequent messages sent to a decoder (e.g., a decoder element within the joint detector-decoder 124 of FIG. 1) by, for example, a channel detector.

Similarly, message update steps may be performed to compute a P type message (also known as an a-posteriori probability (APP) message). Using its initial messages and each of the R type messages received, each variable node of the group of variable nodes may compute a P type message based on the equation:

$$P = L_{initial} + \sum_{j=1}^{d_v} R_j.$$

In addition, each variable node of the group of variable nodes may also compute an extrinsic ($LLR_{EXT}$) message based on the equations:

$$LLR_{APP}(v) = L_{initial} + \sum_{j=1}^{d_v} R_j h_j,$$

where $h_j$ denotes the inverse of the coefficient of the edge connecting variable node v with check node j, and $LLR_{EXT}(v) = LLR_{APP}(v) - L_{initial}$. Some or all of these newly computed messages may be sent to each of the check nodes to which the variable node is connected.

The design of the message passing algorithm 406 may be modified to decode a QC-LDPC code in a more efficient manner. In particular, the schedule of update steps in the message passing algorithm 406 may be altered to exploit properties of the parity check matrix H 125. For example, in an arrangement, the parity check matrix H 125 has a quasi-cyclic structure.

Figure 5:
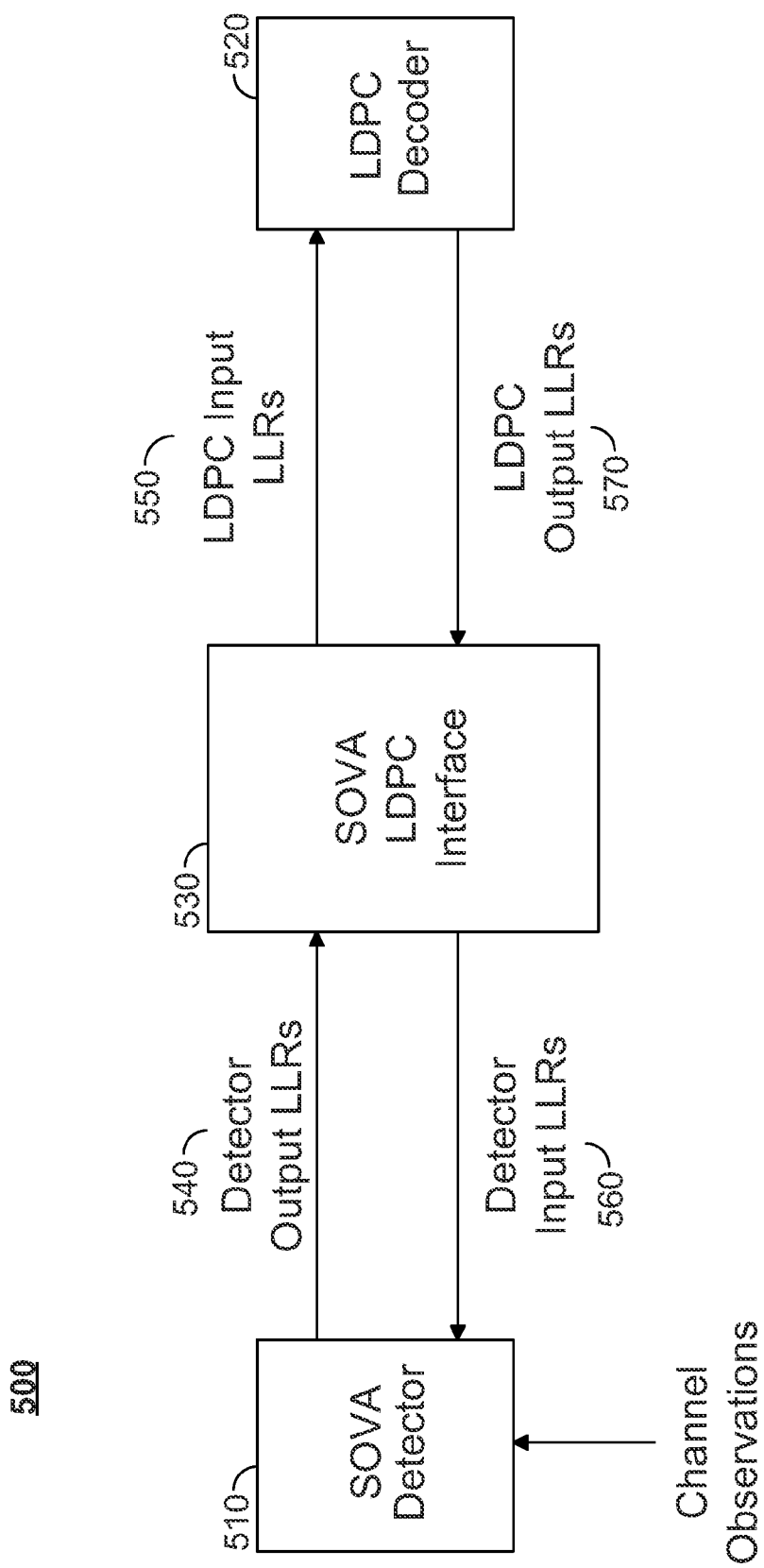
FIG. 5 shows an illustrative detection and decoding system for a communications system in accordance with some arrangements.

FIG. 5 shows an illustrative detection and decoding system for a communications system in accordance with some arrangements. Detector-decoder 500 may correspond to a more detailed embodiment of the joint detector-decoder 124 of FIG. 1. The detector-decoder 500 produces the decoded message 126 of FIG. 1 from the received samples 122 of FIG. 1 by iterating between a soft channel decoder and soft code detector as shown in FIG. 5. In particular, the detector-decoder 500 employs Soft Output Viterbi Algorithm (SOVA) detector 510 as a soft detector and LDPC decoder 520 as a soft decoder.

During a given (outer) iteration of the detector-decoder 500, the SOVA detector 510 passes detector output LLR information 540 to the SOVA LDPC interface 530, and the SOVA LDPC interface 530 passes LDPC input LLR information 550 to the LDPC decoder 520. The LDPC decoder 520 passes LDPC output LLR information 570 to the SOVA LDPC interface 530, and the SOVA LDPC interface 530 passes detector input LLR information 560 to the SOVA detector 510.

The LDPC input LLR information 550 is input to LDPC decoder 520 and used to perform (inner) iterations of a decoding process, as described by FIG. 4, above. At the end of an inner iteration of the LDPC decoder 520, the values stored in each check node are preserved (e.g., stored) for future access.

Figure 6:
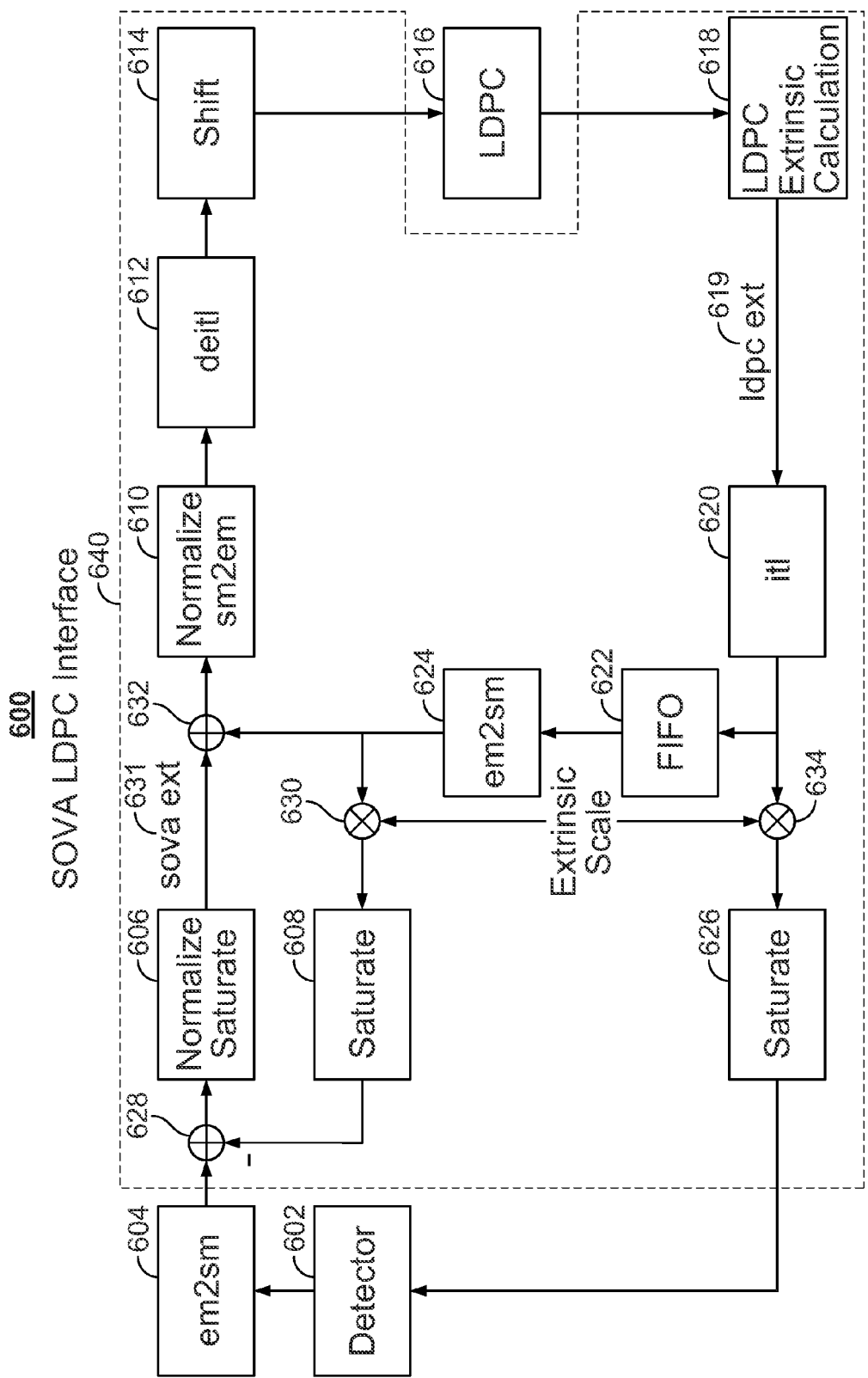
FIG. 6 shows an illustrative detection and decoding system in accordance with some arrangements.

FIG. 6 illustrates a detection and decoding system in accordance with some arrangements. Detector-decoder 600 includes a SOVA detector 602, error metric to symbol metric converters 604 and 624, a normalize/saturate module 606, saturate modules 608 and 626, a normalize/symbol metric to error metric converter 610, a deinterleaver 612, a shifter 614, a decoder 616, an LDPC extrinsic calculation module 618, an interlacer 620, a First-In-First-Out (FIFO) buffer 622, adders 628 and 632, and multipliers 630 and 634. In some arrangements, detector-decoder 600 may correspond to a more detailed embodiment of the detector-decoder 500. For example, the SOVA LDPC interface 530 of FIG. 5 may correspond with the SOVA LDPC interface 640 of FIG. 6, which includes the components enclosed by the dashed lines, i.e. the error metric to symbol metric converters 604 and 624, the normalize/saturate module 606, the saturate modules 608 and 626, the normalize/symbol metric to error metric converter 610, the deinterleaver 612, the shifter 614, the LDPC extrinsic calculation module 618, the interlacer 620, the First-In-First-Out (FIFO) buffer 622, the adders 628 and 632, and the multipliers 630 and 634.

During an outer iteration of the detector-decoder 600, the SOVA detector 602 produces SOVA channel information, which is converted to SOVA extrinsic information 631. The SOVA extrinsic information 631 is subsequently added to LDPC extrinsic information 619 that has been interleaved in the interleaver 620 and buffered in the FIFO 622 to produce updated LDPC channel information. The LDPC channel information is deinterleaved and input into the shifter 614 before being input into the LDPC decoder 616. The shifter 614 cyclically shifts the LDPC channel information circulant to its previous shift position when it was in the LDPC decoder 616 memory at the conclusion of the previous set of inner iterations at the LDPC decoder 616. As a result, the LDPC decoder 616 can continue decoding with the correct starting condition regarding the LDPC channel information circulant. If the LDPC channel information circulant is the initial message of variable nodes sent from the SOVA detector 602 to the LDPC decoder 616, the shifter 614 will shift the circulant to its initial position. The LDPC decoder 616 uses the LDPC channel information to perform inner iterations of a decoding process, as described by FIGS. 4 and 5, above.

The LDPC extrinsic calculation module 618 produces the LDPC extrinsic information 619 based on R and Q-sign data stored within the LDPC decoder 616, as described above. The LDPC extrinsic information 619 passes through interleaver 620, which reduces and/or removes correlation present in the LDPC extrinsic information 619 before passing the interleaved data to the SOVA detector 602. Further, the interleaved LDPC extrinsic information 619 is buffered in the FIFO 622. The interleaved LDPC extrinsic information 619 buffered in the FIFO 622 is input into the adder 632, which adds the SOVA extrinsic information 631 with the LDPC extrinsic information 619 to produce updated LDPC channel information. The LDPC channel information represents updated LLR values (i.e., updated channel information). This iterative processing of LLR values between the SOVA detector 602 and the LDPC decoder 616 may continue until a stopping criterion has been met.

In an embodiment, an outer iteration of the detector-decoder 600 starts from the LDPC extrinsic calculation module 618, which calculates LDPC extrinsic information 619, as described above. The LDPC extrinsic information 619 passes through interleaver 620 and is input into the SOVA detector 602. Further, the interleaved LDPC extrinsic information 619 is buffered in the FIFO 622 and input into the adder 632, which adds the SOVA extrinsic information 631 with the LDPC extrinsic information 619 to produce updated LDPC channel information. The outer iteration continues to the LDPC decoder 616, which runs inner iterations to produce output for the LDPC extrinsic calculation module 618 to compute updated LDPC extrinsic information 619.

Thus, the communications system 100 of FIG. 1 may iteratively decode the output of the demodulator 120 of FIG. 1 as described.

The FIFO 622 requires a relatively small amount of memory. In particular, the amount of memory required is typically much less than what is required to store an entire codeword, e.g. the codeword 108 of FIG. 1. In an arrangement, the depth of the FIFO 622 may be based on a characteristic global data path latency. In some embodiments, the characteristic global path latency includes the latency of the multiplier 634, the SOVA detector 602, the adder 628, the normalize/saturate module 606, and some margin. In some embodiments, the characteristic global data path latency does not include the latency of the LDPC decoder 616. As a result, in an arrangement, the SOVA LDPC interface 640 may support codewords of variable size or variable cardinality.

The LDPC extrinsic calculation module 618 produces the LDPC extrinsic information 619 from information stored within the LDPC decoder 616 after the end of an (inner) iteration of the LDPC decoder 616. In particular, some or all of the variable nodes of the LDPC decoder 616 have computed the quantity $$LLR_{APP}(v) = L_{initial} + \sum_{j=1}^{d_v} R_j h_j,$$

where, as described above, v denotes a variable node index, $L_{initial}$ refers to SOVA extrinsic information, and terms $R_1$ through $R_{d_v}$ are R terms. At the end of an (inner) iteration of the LDPC decoder 616, the LDPC extrinsic calculation module 618 produces the quantity $$LE(v) = \sum_{j=1}^{d_v} R_j h_j,$$

where $h_j$ denotes the inverse of the coefficient of the edge connecting variable node v with check node j. The coefficient $h_j$ may be derived from the $(j,v)^{th}$ element of the parity check matrix corresponding to the LDPC decoder 616. For example, in an arrangement, the parity check matrix H 125 is the parity check matrix of LDPC decoder 616, and the coefficient $h_j$ is derived from the $(j,v)^{th}$ element of the parity check matrix H 125. In an arrangement, the LDPC extrinsic calculation module 618 determines LE(v) without relying on memory storage for the term $L_{initial}$ (e.g., without subtracting the quantity $L_{initial}$ from $LLR_{APP}(v)$).

Figure 7:
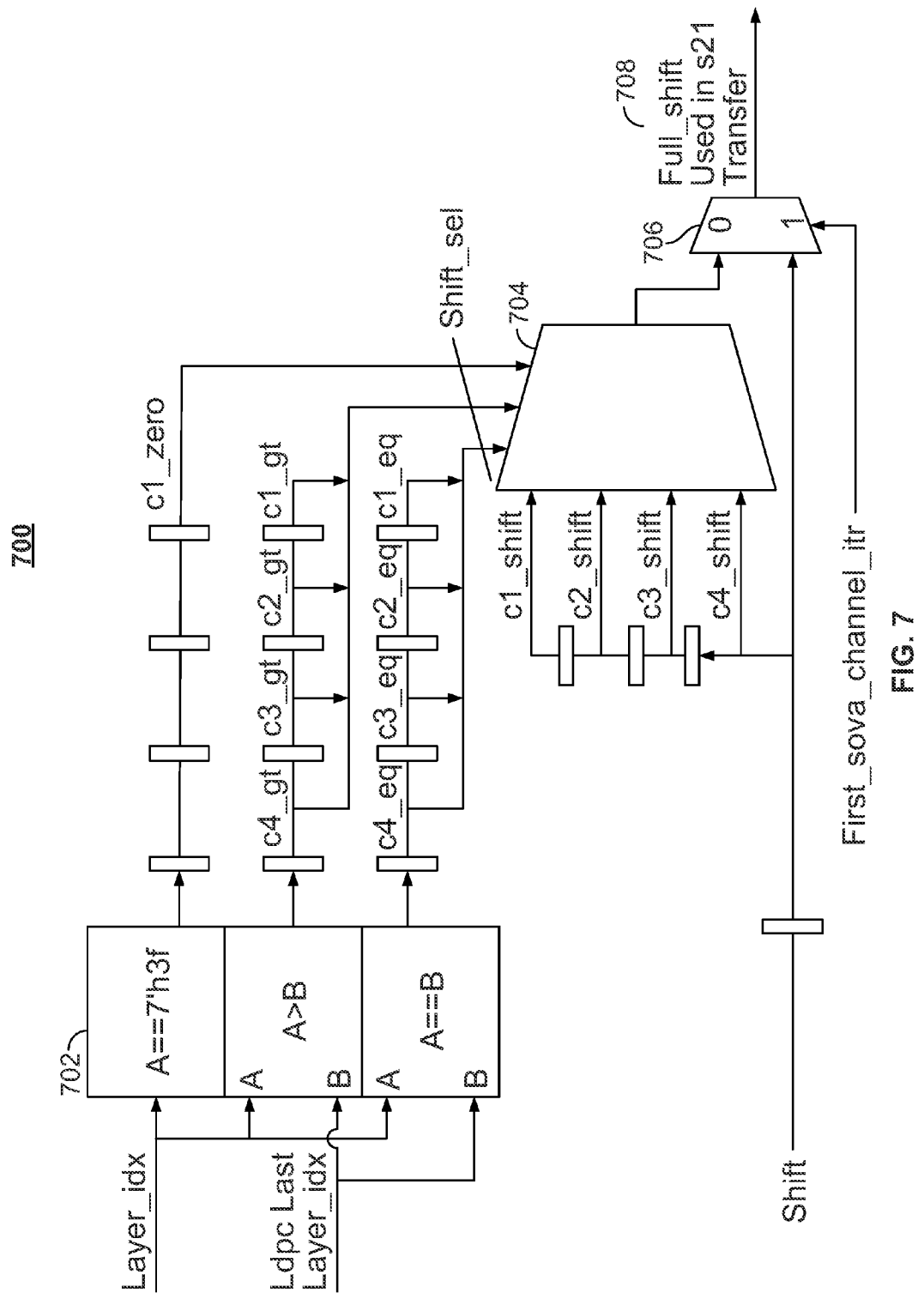
FIG. 7 shows an illustrative full shift calculation module in accordance with some arrangements.

FIG. 7 shows an illustrative full shift calculator in accordance with some arrangements. Full shift calculator 700, for example, may correspond to a detailed embodiment of the shifter 614 of FIG. 6. The full shift calculator 700 cyclically shifts an LDPC channel information circulant to a desired position and writes the circulant into an LDPC decoder's memory, as described previously. The full shift calculator 700 includes a comparator 702, a shift multiplexer 704, and a multiplexer 706. The full shift calculator 700 may be implemented, for example, in the shifter 614, in the LDPC extrinsic computation module 618, or in some other suitable location in the detector-decoder 600 of FIG. 6.

During the computation of the LDPC extrinsic information 619 of FIG. 6, the SOVA LDPC interface 640 reads from a schedule file to obtain parity check matrix information, which includes the location of the non-zero circulants (NZCs) in the parity check matrix, their full shift values, and other information necessary for the calculation of the LDPC extrinsic information 619. For example, there may be at most four NZCs aligned with each variable node circulant. As shown in FIG. 7, the full shift calculator 700 processes all four full shifts of the four NZCs corresponding to each variable node circulant. The full shift calculator 700 outputs a full shift value 708 of the previous circulant processed by the LDPC decoder 616 for the current variable node. The full shift value 708 is saved in the FIFO 622 as part of the LDPC extrinsic information 619. The shifter 614 shifts a P circulant based on the full shift value 708 so that the LDPC decoder 616 can continue its inner iterations from a correct start condition.

As shown in FIG. 7, in an embodiment, the output of the shift multiplexer 704 is determined by the following expression:

shift_sel={full_shift_valid& (c4_eq|(~c4_gt)|
((c1_zero==1'b1)?c4_gt:c1_gt)),full-
_shift_valid&(c3_eq|((~c3_gt)&c4_gt)),full-
_shift_valid&(c2_eq|((~c2_gt)&c3_gt)),full_
shift_valid&(c1_eq|((~c1_gt)&c2_gt))};

The shift input and the output of the shift multiplexer 704 and are input into the multiplexer 706, which takes first_sova_channel_itr, the initial SOVA detector information, as a selector bit during the first outer iteration of the detector-decoder 600.

Figure 8:
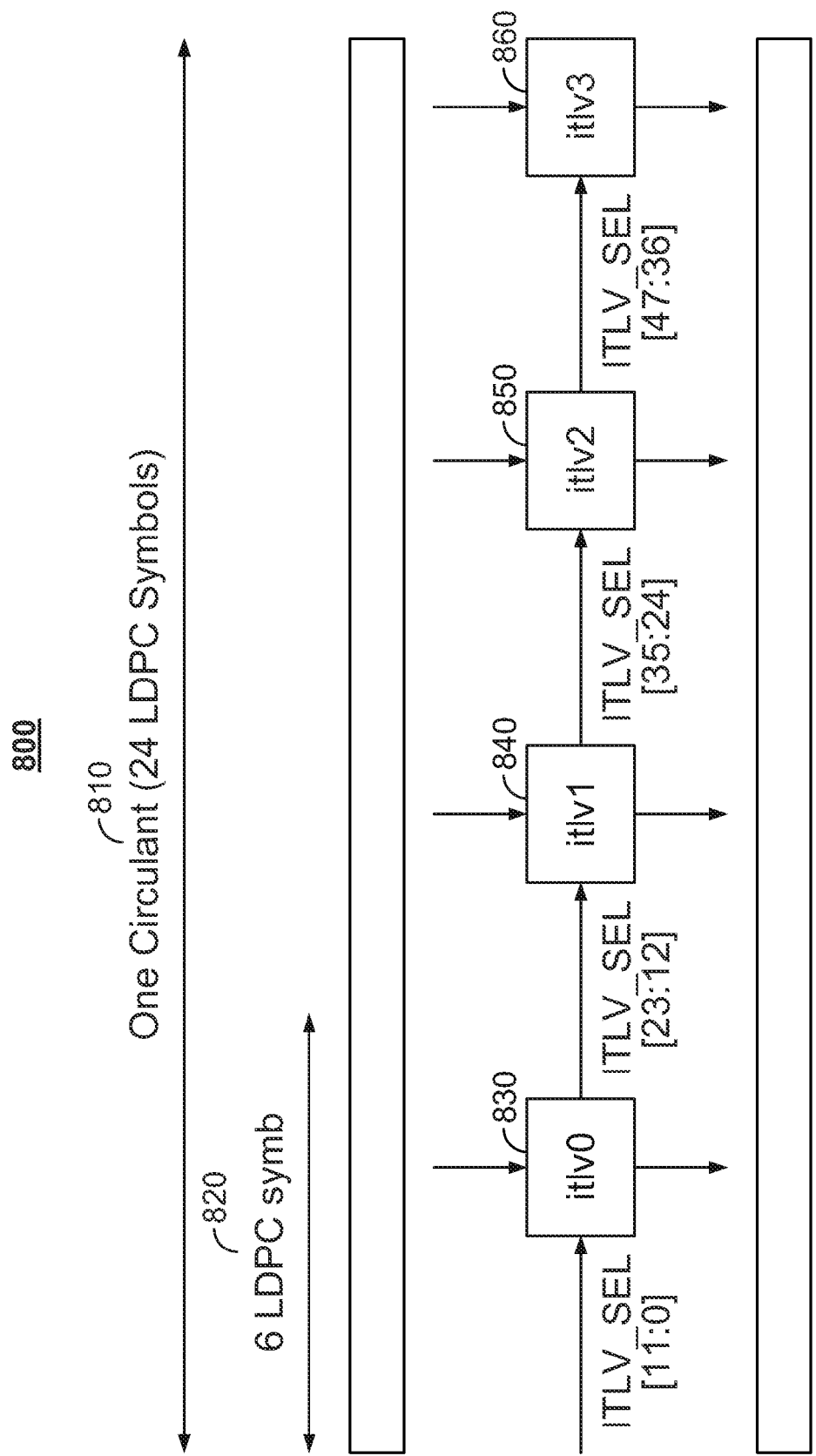
FIG. 8 shows an illustrative interleaver in accordance with some arrangements.

FIG. 8 shows an illustrative interleaver in accordance with some arrangements. Interleaver 800 may correspond to a detailed embodiment of the interleaver 620 of FIG. 6. The interleaver 800 breaks "pseudo-cycles" caused by multi-bit error events in an intersymbol interference (ISI) channel and improves thermal asperity correction power for quasi-cyclic LDPC codes. As a result, the interleaver 800 reduces and/or removes correlation present in LDPC extrinsic information, such as the LDPC extrinsic information 619, before the information is passed to a detector, such as the SOVA detector 602 of FIG. 6.

As shown in FIG. 8, the interleaver 800 includes four smaller block interleavers 830, 840, 850, and 860. In a preferred arrangement, a circulant 810 has 24 LDPC symbols and is divided into 4 separate sub-circulants 820 each having 6 LDPC symbols. Each block interleaver may implement a separate programmable interleaving function so that the interleaver 800 may implement up to 4 different programmable interleaving functions.

The inputs ITLV_SEL[47:0] specify the interleaving functions. For example, inputs ITLV_SEL[11:0] choose the block interleaver 830, and inputs ITLV_SEL[23:12] choose the block interleaver 840.

Figure 9:
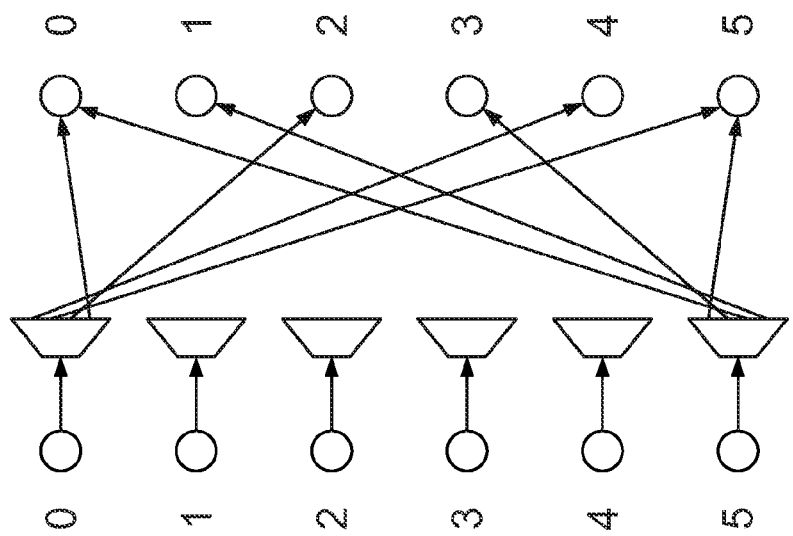
FIG. 9 shows an illustrative example of the operation of a programmable interleaver in accordance with some arrangements.

FIG. 9 shows an illustrative example of the operation of a programmable interleaver in accordance with some arrangements. Programmable interleaver 900 operates on 6 LDPC symbol inputs numbered from 0 to 5, and each symbol can be mapped to 4 possible symbol outputs, as depicted in both the bipartite graph and the table of FIG. 9. For example, input 0 may be mapped to outputs 4, 5, 2, or 0. The programmable interleaver 900 may be implemented, for example, in a system of multiplexers.

The above described arrangements and embodiments are presented for the purposes of illustration and not of limitation. For example, the described techniques may be performed without storage of one or more variables produced by a SOVA detector. Further, one or more parts of techniques described above may be performed in a different order (or concurrently) and still achieve desirable results. In addition, the techniques of the disclosure may be implemented in hardware, such as on an application specific integrated circuit (ASIC) or on a field-programmable gate array (FPGA). The techniques of the disclosure may also be implemented in software, or in a combination of hardware and software.

What is claimed is:

1. A method for decoding a codeword using a decoder, the method comprising:
   computing a plurality of R messages corresponding to a variable node of the decoder;
   forming decoder extrinsic information for the variable node by combining the plurality of R messages;
   storing the decoder extrinsic information in a memory during a first time period, wherein a depth of the memory is based on a characteristic data path latency, and independent of a number of symbols in the codeword;
   retrieving the decoder extrinsic information from the memory during a second time period, the second time period occurring after the first time period; and
   providing the decoder extrinsic information to a soft detector.

2. The method of claim 1, wherein the memory is implemented as a First-In-First-Out (FIFO) buffer.

3. The method of claim 2, comprising:
   retrieving the decoder extrinsic information from the FIFO buffer; and
   combining the decoder extrinsic information with detector extrinsic information.

4. The method of claim 1, wherein:
   the decoder is connected in series with a full shift calculator module, and
   the full shift calculator module is configured to cyclically shift a decoder channel information circulant to a desired position and write the circulant into a memory of the decoder.

5. The method of claim 4, comprising providing, by the full shift calculator, a full shift value for cyclically shifting the decoder channel information circulant.

6. The method of claim 1, comprising inputting the detector extrinsic information into an interleaver.

7. The method of claim 1, wherein the characteristic data path latency comprises a characteristic global data path latency of the soft detector.

8. The method of claim 1, wherein the characteristic data path latency is based on a latency associated with a length of an outer iteration of the soft detector.

9. The method of claim 1, wherein the length of the codeword is variable.

10. The method of claim 1, wherein the characteristic data path latency is independent from a latency of the decoder.

11. A system for decoding a codeword, the system comprising:
    a detector-decoder interface comprising a memory;
    a decoder configured to:
       compute a plurality of R messages corresponding to a variable node of the decoder using a message passing process;
       form decoder extrinsic information for the variable node by combining the plurality of R messages; and
       provide the decoder extrinsic information to the detector decoder interface for storing the decoder extrinsic information in the memory during a first time period, wherein a depth of the memory is based on a characteristic data path latency, and independent of a number of symbols in the codeword; and
    a soft detector configured to:
       receive the decoder extrinsic information from the memory during a second time period, the second time period occurring after the first time period; and
       form detector extrinsic information for processing by the detector-decoder interface.

12. The system of claim 11, wherein the memory is implemented as a First-In-First-Out (FIFO) buffer.

13. The system of claim 11, wherein the detector-decoder interface is configured to combine the decoder extrinsic information and the detector extrinsic information.

14. The system of claim 11, wherein:
    the decoder is connected in series with a full shift calculator module, and the full shift calculator module is configured to cyclically shift a decoder channel information circulant to a desired position.

15. The system of claim 14, wherein the full shift calculator module is further configured to write the circulant into a memory of the decoder.

16. The system of claim 11, comprising an interleaver configured to interleave the detector extrinsic information.

17. The system of claim 16, wherein the interleaver comprises four interleaving functions.

18. The system of claim 17, wherein the interleaving functions are programmable.

19. The system of claim 11, wherein a length of the codeword is variable.

20. The system of claim 11, wherein the characteristic data path latency comprises a characteristic global data path latency of the soft detector and is independent from a latency of the decoder.

* * * * *